United States Patent [19]

Sawada et al.

[11] 4,330,808
[45] May 18, 1982

[54] AUTOMATIC CONTROL FOR PROCESSING SIGNALS FROM AN OVERHEAT MONITOR OF A DYNAMOELECTRIC MACHINE

[75] Inventors: Fred H. Sawada; Sterling C. Barton; Federico S. Echeverria, all of Scotia; Chester C. Carson, Ballston Spa, all of N.Y.

[73] Assignee: General Electric Company, Schenectady, N.Y.

[21] Appl. No.: 12,073

[22] Filed: Feb. 14, 1979

Related U.S. Application Data

[63] Continuation-in-part of Ser. No. 820,608, Aug. 1, 1977, abandoned.

[51] Int. Cl.³ .......................... H02H 5/04; H02H 7/08
[52] U.S. Cl. ..................................... 361/25; 361/103; 340/628; 73/28; 374/152
[58] Field of Search ...................... 361/25, 24, 103, 26, 361/27, 86; 73/1 F, 23.1, 28, 339 R, 343 R; 340/628, 629, 506; 310/55, 56, 66, 68 B, 68 C; 307/360, 361; 328/147, 150

[56] References Cited

U.S. PATENT DOCUMENTS

| | | | |
|---|---|---|---|
| 3,427,880 | 2/1969 | Grobel et al. | 73/339 R |
| 3,573,460 | 4/1971 | Skala | 250/83.6 |
| 3,702,561 | 11/1972 | Carson et al. | 73/1 F |
| 3,809,960 | 5/1974 | Jossic | 361/25 |
| 3,812,401 | 5/1974 | Radin | 361/86 X |
| 3,916,671 | 11/1975 | Carson et al. | 73/23.1 |
| 3,972,225 | 8/1976 | Fort et al. | 73/28 |
| 4,072,997 | 2/1978 | Boothmann et al. | 361/24 X |

Primary Examiner—Patrick R. Salce
Attorney, Agent, or Firm—Ormand R. Austin; John F. Ahern

[57] ABSTRACT

An electronic control system to automatically determine the validity of an apparent overheating signal from an overheat monitor of a gas-cooled dynamoelectric machine and reduce machine load or indicate a monitor malfunction. Upon receipt of an apparent overheat signal by the control system, filtration of the monitored cooling gas is automatically initiated to remove pyrolysates released into the gas by overheated elements within the machine. A normal monitor response is thereby effected, provided the overheat signal is valid. If filtration of the monitored cooling gas fails to elicit a normal response within a preselected time period a monitor malfunction is indicated. The control system initiates a scheduled reduction in machine load either subsequent to validation of overheating or as verification is initiated, and if a valid indication of overloading persists, trips the excitation and remaining load from the machine. Redundant current paths, high-speed solid-state comparators, and timing elements are included in the control system for verifying the monitor signals.

6 Claims, 6 Drawing Figures

AUTOMATIC CONTROL FOR PROCESSING SIGNALS FROM AN OVERHEAT MONITOR OF A DYNAMOELECTRIC MACHINE

CROSS-REFERENCE TO RELATED APPLICATION

This is a Continuation-In-Part of copending application Ser. No. 820,608, filed Aug. 1, 1977, and now abandoned.

BACKGROUND OF THE INVENTION

This invention relates to a system for processing signals from an overheat monitor for a gas-cooled dynamoelectric machine. In particular the invention concerns an electronic control which automatically determines the validity of an apparent overheating signal and initiates a reduction in machine load or a monitor malfunction signal.

Overheating in stator cores of gas-cooled dynamoelectric machines, such as that resulting from foreign object damage to stator teeth allowing electrical contact between core laminations and thus resistance heating, can rapidly cause local melting of core laminations, leading to costly machine repairs and outages. Other overheating, for example, to other iron or copper parts of the stator can cause costly and increasing damage. To minimize damage, it is very desirable to detect overheating in its earliest stages so that load carried by the machine can be reduced and appropriate corrective action taken at minimal cost and outage time.

Systems for detection of machine overheating are disclosed in several U.S. Pat. Nos. assigned to the assignee of the present invention, i.e., 3,427,880 to Grobel et al; 3,573,460 to Skala; 3,702,561 and 3,916,671 to Carson et al, the disclosures of which are incorporated herein by reference thereto. The systems described therein are based primarily on the principle that at onset of overheating in a dynamoelectric machine, decomposition of materials such as the coatings normally applied to certain machine parts (or intentionally applied for the express purpose of detecting overheating) yields pyrolysate products including submicron particles, which become entrained in the machine gas coolant. U.S. Pat. No. 3,573,460 to Skala discloses an ion chamber detector in which gas is ionized and electrical current resulting from the ionized gas is measured to determine whether submicron particles are present; the presence of submicron particles causes a measurable decrease in current because some ions collide with and attach themselves to the particles, decreasing the mobility of these ions and the likelihood of their collection and contribution to ion current.

This ion chamber detector is applied to an overheat monitor in U.S. Pat. No. 3,427,880 to Grobel et al according to which disclosure a portion of the gas coolant from a dynamoelectric machine is passed through the ion chamber detector and the resulting current monitored for presence of pyrolysates.

Further refinements to overheat detectors are disclosed in U.S. Pat. Nos. 3,702,561 and 3,916,671 to Carson et al and U.S. patent application Ser. No. 783,772 (Barton et al) filed Apr. 1, 1977. In the disclosure of U.S. Pat. No. 3,702,561 a submicron particle filter is included to remove particles from the gas coolant and verify the overheat signals by detection of an increase in ion current level, and a coated filament is provided to check the performance of the detector by producing pyrolysate particles to simulate overheating. U.S. Pat. No. 3,916,671 discloses the addition of gas chromatographic apparatus to the monitor system for identifying specific pyrolysate materials and thus their source within the machine. U.S. patent application Ser. No. 783,772 discloses the use of two ion chamber detectors, one of which can be heated to gasify any oil mist particles present, thus providing means for differentiation between a detector output due to machine overheating and a detector output due to oil mist particles entrained in the gas coolant.

While the foregoing prior art inventions represent significant advances in early detection of local overheating in a dynamoelectric machine, their use in practice has not been as effective as may be desired because of the lengthy period of time required to fully respond to a machine overheat and because the judgment and actions of each individual machine operator may lead to different and sometimes inappropriate responses to apparent overheating. Thus in certain circumstances and installations, as much as five minutes may elapse after onset of overheating before corrective action is completed; during this time there is first cognizance of apparent overheating, followed by dispatch of personnel to the location of the overheat detector (which may be remote from the main control room), then activation by these personnel of a verification system such as a particle filter, and finally, after overheating is validated, a reduction in machine load to a level at which overheating ceases or the excitation system and main line breaker of the machine may be tripped. During the several minutes which elapse prior to reduction of load to safe operating levels serious damage may occur to the machine such as melting of the core. Alternatively, if load reduction or runback is initiated prior to validation of overheating, unnecessary loss of power generation and inefficient use of fuel may occur if, after a lengthy verification sequence, the drop in signal is proved spurious, e.g., caused by ion chamber detector current leakages, calibration errors, or other malfunctions associated with peripheral recording and amplification equipment of the monitor.

Accordingly, it is a general object of the invention to provide a system to automatically process signals from an overheat monitor for a gas-cooled dynamoelectric machine of the type used to generate electrical current in response to a rotating field.

It is another object of the invention to provide a system to rapidly determine the validity of an apparent overheat signal as indicated by a drop in output signal from an overheat monitor.

An additional object of the invention is to eliminate the subjective evaluation of apparent overheat signals and provide therefor an electronic control system of design having high operational reliability.

A further object of the invention is to provide a system which will automatically initiate reduction in load of a dynamoelectric machine, trip the machine, or indicate a malfunction of the overheat monitor in conjunction with determination of overheat signal validity.

SUMMARY OF THE INVENTION

In a preferred embodiment the invention provides, in combination with an overheat monitor for a gas-cooled dynamoelectric machine, an electronic control system for automatically verifying an apparent overheat signal as indicated by a drop in the output signal from the monitor and for initiating reduction in load applied to the machine or for indicating a monitor malfunction. The control system includes high-speed comparators, logic gates, and delay circuits to process signals from the overheat monitor, a network for activating a particle filter which is used as an integral part of signal verification, and light-emitting diodes to indicate the various operating states of the control systems, including an alert state which provides an early warning of possible machine overheating. The control initiates reduction of machine load either subsequent to validation of overheating or as verification is initiated, and provides for tripping the excitation and remaining load from the machine if a valid indication of overheating persists. Also included in the invention are switching networks to allow testing of the control system and to provide for continued cycling of the system after signal verification.

BRIEF DESCRIPTION OF THE DRAWINGS

While the specification concludes with claims particularly pointing out and distinctly claiming the subject matter regarded as the invention, the invention will be better understood from the following description taken in connection with the accompanying drawings in which:

DETAILED DESCRIPTION OF THE INVENTION

Figure 1:
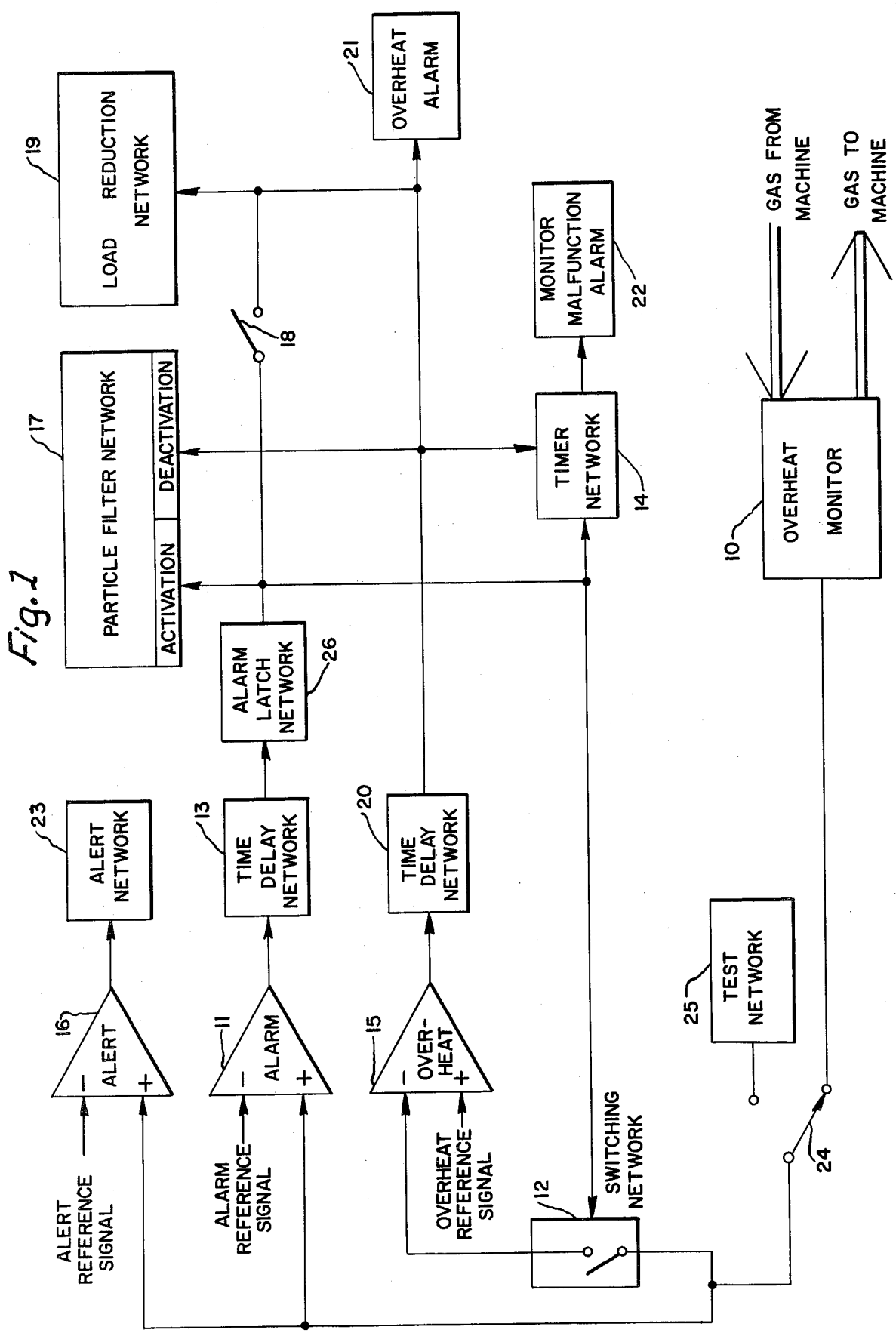
FIG. 1 is a block diagram of a preferred arrangement of the control system in accordance with the invention.

FIG. 1 illustrates the major networks of a preferred embodiment of the invention and the flow of signals during its operation. An overheat monitor 10 is used to monitor the gas coolant of a dynamoelectric machine (not shown) which includes a rotor having a rotatable field and a stator whose windings may also be cooled internally with a liquid. The overheat monitor 10 may be of the type shown and described in U.S. Pat. Nos. 3,427,880 to Grobel et al and 3,702,561 to Carson et al, and includes a particle filter which can be activated for removal of submicron particles from the gas coolant which passes through the monitor, and typically also includes a recorder for plotting monitor signals on a time chart, and a signal amplifier.

At the onset of local overheating in a machine, submicron pyrolysate particles are released into the gas coolant flow from the dynamoelectric machine to the overheat monitor 10 causing a drop in monitor current signal. The monitor signal is a direct current signal produced by amplifying the ion current of the overheat monitor detector.

Figure 2:
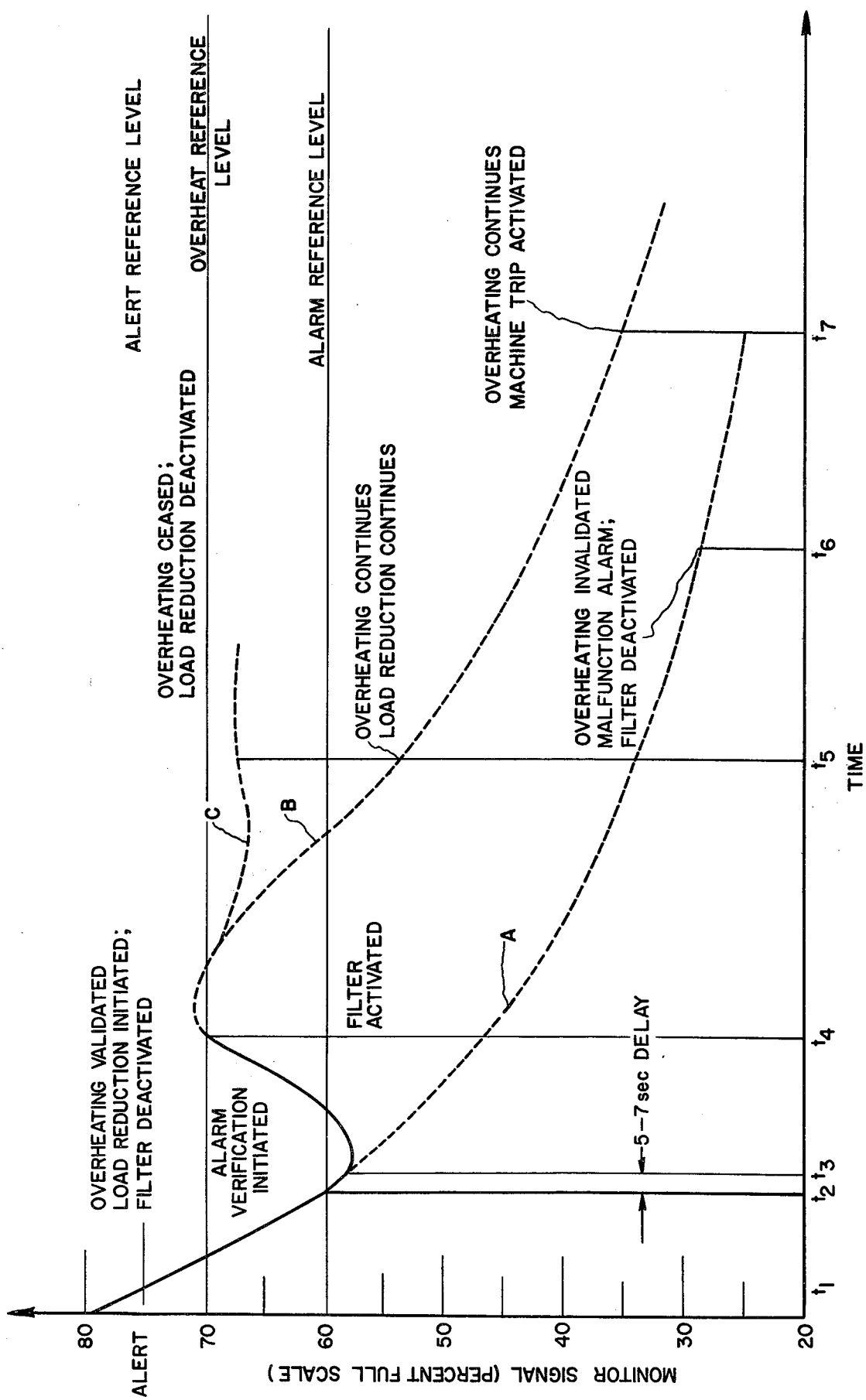
FIG. 2 is a drawing of typical monitor signal variations with time indicating various steps in the control sequence.

FIG. 2 shows a typical monitor signal pattern during overheating and its verification in accordance with the invention, and is referred to for further description of the operation of the arrangement of FIG. 1. This preferred arrangement of the control system comprises an alert network including alert comparator 16 and alert network 23; an alarm network including alarm comparator 11, alarm latch network 26, and time-delay network 13; a switching network 12; an overheat network including overheat comparator 15, time-delay network 20, and overheat alarm 21; a particle filter network 17; a load reduction network 19; and a malfunction network including timer network 14 and monitor malfunction alarm 22.

The monitor signal is applied to the input of alarm comparator 11 and to the input of switching network 12. If, due to machine overheating or a monitor malfunction, the monitor signal drops to a level equal to that of an alarm reference signal also applied to the input of alarm comparator 11, comparator 11 is energized and its output is fed to delay network 13, effective to remove transient signals, and whose output activates alarm latch network 26. In FIG. 2 the solid line beginning at 80 percent of full scale represents the monitor signal and is illustrated dropping to the alarm level shown for example at 60 percent of full scale.

The switching network 12 is caused to close by the output signal from alarm latch network 26, thereby coupling the monitor signal to overheat comparator 15. The output signal from alarm latch network 26 also energizes particle filter network 17 and activates the timer network 14 to initiate a preselected time period. Energizing particle filter network 17 causes gas flowing through the overheat monitor 10 to pass through a particle filter (not shown) which removes any pyrolysate particles present in the gas flow. In one mode of operation of the invention, with switch 18 preset in a closed position, load reduction network 19 is also triggered. If machine overheating is occurring, the monitor signal will rise in response to removal of pyrolysate particles by the particle filter effectively eliminating the apparent overheating signal and de-energizing alarm comparator 11. The alarm latch network 26, however, remains energized, in turn maintaining activation of switching network 12, timer network 14, and particle filter network 17. When the monitor signal recovers to the level of the overheat reference signal (shown at 70 percent of full scale in FIG. 2) applied to the input of overheat comparator 15, comparator 15 is energized. The output signal from comparator 15, after having transients removed by delay network 20, activates overheat alarm 21 and load reduction network 19, and deactivates particle filter 17 and timer network 14. Activation of the load reduction network 19 initiates reduction of load applied to the machine in an attempt to minimize damage and eliminate overheating.

If, on the other hand, overheating is not occurring and pyrolysate particles are thus not present in the gas flow, application of the filter to the gas flow will not cause a rise in the monitor signal to de-energize alarm comparator 11 or energize overheat comparator 15. Instead, the preselected time period of timer network 14 is allowed to expire and monitor malfunction alarm 22 is triggered, indicating that the initial drop in monitor signal was not due to overheating but to a malfunction such as leakage of coolant gas or problems with the ion chamber or peripheral equipment of the overheat monitor 10.

The monitor signal, in this preferred arrangement, is also applied to the input of alert comparator 16 which has an input reference signal to establish a monitor signal level at which the output of alert comparator 16 is energized. The alert reference level is shown at 75 percent of full scale in FIG. 2. The output of comparator 16 is applied to alert network 23 to provide visual and audible alarms of an initial drop in the monitor signal and of an alert condition.

If switch 24 is connected to test network 25, operation of the control system may be checked by substituting signals from test network 25 for signals from the overheating monitor 10 thereby simulating various monitor output conditions.

Figure 3:
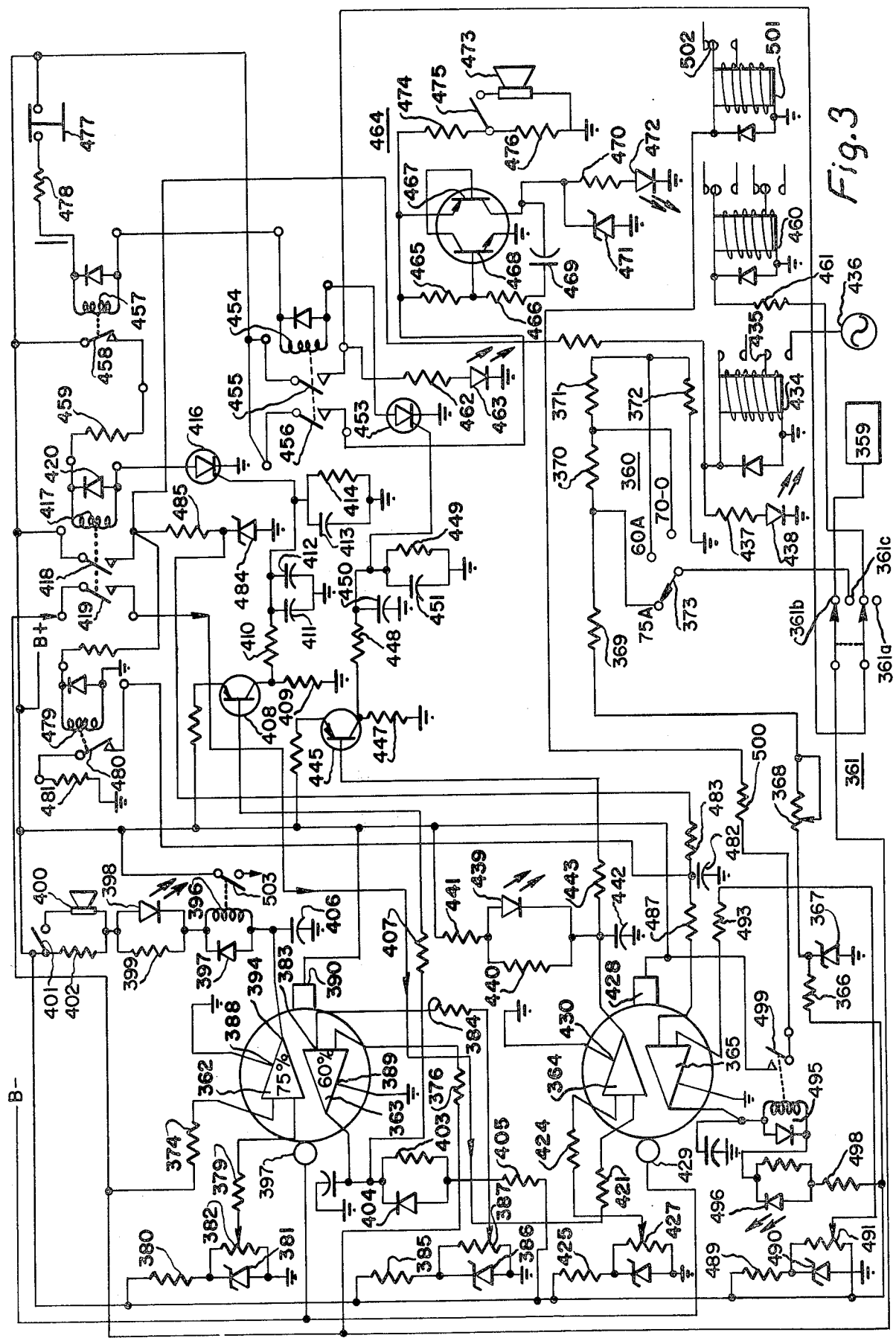
FIG. 3 is a schematic circuit diagram of a preferred embodiment in accordance with the invention as illustrated by the block diagram of FIG. 1.

FIG. 3 shows a detailed schematic diagram of a preferred arrangement of the control system illustrated in the block diagram of FIG. 1 wherein all points marked B+ are connected by a common bus line (not shown) to a positive regulated DC voltage supply and all points marked B− are connected by a common bus line (not shown) to a negative regulated DC supply voltage.

In FIG. 3, a signal from either overheat monitor 359 or test network 360 is fed through contact 361b of switch 361 to the input of alert comparator 362 and alarm comparator 363, which, along with overheat comparator 364 and timer comparator 365, are solid-state high-speed voltage comparators. Test network 360 includes resistor 366 and zener diode 367, series-connected resistors 368, 369, 370, 371 and 372, and a 3-position selector switch 373 and allows various current signal inputs to be fed to the control system to simulate machine overheating or monitor malfunction. If the non-test operating mode shown, with switch 361 connected to terminal 361b, a current signal is fed from overheat monitor 359 through resistor 374 to the non-inverting input terminal of alert comparator 362 and through resistor 376 to the non-inverting input terminal of alarm comparator 363. Also applied to the inverting input terminal of alert comparator 362 through resistor 379 is a reference signal from an alert reference network comprising resistor 380, zener diode 381, and potentiometer 382. A similar reference signal of appropriate level is fed to the inverting input terminal of alarm comparator 363 through resistor 384 from an alarm reference network comprising resistor 385, zener diode 386, and potentiometer 387. Comparators 362 and 363 also include, respectively, terminals 388 and 389 connected to ground, 390 to positive regulated DC voltage supply B+, and 397 to negative regulated DC voltage supply B−.

When the monitor signal from overheat monitor 359 decreases to the value of the alert reference signal applied to alert comparator 362, comparator 362 is activated, generating an output current signal which passes through relay coil 396 and diode 397, connected in parallel, and turns on light-emitting diode (LED) 398 and also passes through the redundant current path provided by resistor 399. The output signal from comparator 362 also activates audible alarm means 400, which has switch 401 in series and redundant current path resistor 402 in parallel. Capacitor 406 is connected to the output of comparator 362 to act as a transient filter. Capacitors are similarly connected at the outputs of comparators 363, 364, and 365.

As the monitor signal decreases to the value of the alarm reference signal applied to alarm comparator 363, comparator 363 is activated, producing an output which passes through resistor 403, providing a redundant current path around LED 404 and through resistor 405, returning to the B+ bus. The output signal of the alarm comparator 363 is also applied through resistor 407 to the base of transistor 408 shifting the transistor 408 from a non-conducting to a conducting state. The conduction current from the emitter of transistor 408 passes through voltage dropping resistor 409 to ground. The resistance-capacitance network formed by resistors 410 and 414, and capacitors 411, 412, and 413 provides a time delay and transient filter prior to the signal being applied to the gate of silicon-controlled rectifier (SCR) 416, thereby firing SCR 416 into conduction which in turn energizes relay 417, closing switches 418 and 419. It will be understood that relay 417 and each of the relays to be described herein are connected in parallel to suitable protective diodes such as diode 420 which clip or suppress voltage spikes induced by the relays. Closure of switch 419 couples the monitor signal from overheat monitor 359 to overheat comparator 364 by feeding the signal through resistor 421 to the inverting input terminal of comparator 364. The non-inverting input terminal of overheat comparator 364 receives an overheat reference signal through resistor 424 from a reference network including resistor 425, zener diode 426, and potentiometer 427, and also includes terminals 428 and 429 connecting the comparator 364 to positive voltage supply B+ and negative voltage supply B−, and terminal 430 to ground. Closure of switch 418 by relay 417 connects the B+ source to particle filter relay coil 434, closing its contacts 435 to a 115 volt AC source 436, energizing a solenoid valve (not shown) which causes gas in the overheat monitor 359 to flow through a particle filter (not shown). Closure of switch 418 also causes a signal to pass through resistor 437 and turn on LED 438.

Introduction of the particle filter into the system causes removal of pyrolysate particles (present in the gas coolant from machine overheating) which results in an increase in monitor current signal. When the monitor signal recovers to the value of the overheat reference signal applied to overheat comparator 364, comparator 364 is activated, producing an output current which activates light-emitting diode (LED) 439 and returns, through redundant current path resistor 440 and voltage dropping resistor 441 to the B+ supply. The output signal from the overheat comparator 364, after being filtered of transients by capacitor 442, is coupled through current-limiting resistor 443 to the base connection of transistor 445, thereby bringing transistor 445 into a conduction state.

The onset of transistor 445 conduction applies a triggering pulse through a time-delay and noise-suppressing network including resistors 447, 448, and 449, and capacitors 450 and 451 to the gate of SCR 453, firing SCR 453 which in turn energizes relays 454 and 457, closing contacts 455 and 456, and opening normally closed contact 458. Opening contact 458 breaks the B+ connection to SCR 416, through resistor 459, and thereby de-energizes relay 417. De-energizing relay 417 causes contacts 418 and 419 to open, uncoupling the particle filter from the system, and disconnecting the overheat signal from the input of the overheat comparator 364.

Closure of relay contact 455 supplies B+ voltage through contacts 361a of switch 361 and resistor 461 to energize load reduction relay 460 which is effective to reduce the machine loading. The B+ voltage is also coupled through contact 455 to resistor 462 and LED 463 to provide a visual indication that load reduction circuitry is activated.

Closure of relay contact 456 also activates overheat flashing alarm network 464 which includes resistors 470 and 465, and 466, transistors 467 and 468, capacitor 469, diode 471, and light-emitting diode 472. The flashing network 464 is also designed to activate audible alarm 473 through resistor 474 and a silencer switch 475. A redundant current path around the audible alarm 473 is provided through resistor 476.

The load reduction relay 460, load reduction LED 463, and the flashing network 464 with its audible alarm 473, remain activated until reset switch 477 is momentarily opened to remove the B+ voltage from SCR 453 thereby allowing relays 454 and 457 to be de-energized. A resistor 478 is provided in series with reset switch 477.

The remainder of the control system illustrated in FIG. 3 processes monitor signals which vary for reasons other than overheating. If the monitor signal decreases for causes not associated with overheating, filtering of the gas flow will not cause a recovery in monitor signal and hence overheat comparator 364 will not be activated. Instead, the decreasing monitor signal will activate, and maintain in an active state, comparator 362 and 363. As described above, activation of comparator 363 leads to energization of relay 417 and closure of contacts 418 and 419. The B+ voltage is thus applied through relay contact 418 to relay coil 479, opening normally closed contact 480 to break the ground path through resistor 481. Capacitor 482 coupled with resistor 483 form a resistance-capacitance timing network, which, with opening of contact 480 allows the capacitor 482 to begin charging to a higher voltage as supplied by the voltage regulator diode 484 and dropping resistor 485. The voltage developed across timing capacitor 482 is applied to the inverting input terminal of timing comparator 365 through resistor 487.

Also applied to the non-inverting input terminal of timing comparator 365 through resistor 493 is a reference signal from a timing reference network comprising resistor 489, zener diode 490, and potentiometer 491. Timing capacitor 365 also includes respectively, terminals 428 and 429 connected to positive regulated DC voltage supply B+ and negative regulated DC voltage supply B−.

The voltage across capacitor 482, as applied to the inverting input terminal of comparator 365, will increase at a predetermined rate until it is equal to the voltage applied to the non-inverting input terminal by the timing reference network, a period requiring, for example, 3.5 minutes. At that point, the output of timing comparator 365 is activated to energize relay 495 and LED 496. Resistor 497 provides a redundant current path around LED 496, both being in series with resistor 498 to return to the B+ voltage.

Energizing relay 495 closes relay contact 499 to apply B+ voltage through resistor 500 to the monitor malfunction relay 501. Thus LED 496 provides a visual indication that the apparent overheat signal is invalid and relay 501 provides, through contact 502, for a remote auxiliary indication of a monitor malfunction or signal invalidity.

Operation

At the onset of machine overheating, the overheat monitor 359 responds with a decreasing DC output signal. This monitor signal is applied through contact 361b of switch 361 to an input of the alert comparator 362 and to an input of the alarm comparator 363. As the monitor signal drops to the level of the alert reference, also applied to an input of the alert comparator 362, the alert comparator 362 output is activated to provide visual indication through LED 398 and audible indication through audible alarm 400 that an alert condition exists. Relay 396 is activated to provide, through contacts 503, a means for remote indication of an alert condition.

If the overheating signal continues to drop, for example to 60 percent of full scale (equal to the alarm reference), the output of alarm comparator 363 will be energized, triggering transistor 408 into conduction, in turn firing SCR 416 (after a short time delay) to energize relay 417. Closure of contacts 418 of relay 417 further causes energization of relay 434 which activates the particle removal filter. The closing of contact 419 of relay 417 couples the overheat monitor signal to an input terminal of overheat comparator 364.

When, after filtration of pyrolysate particles from the gas flow, the monitor signal recovers to 70 percent of full scale (equal to the overheat reference) the overheat comparator 364 is activated, energizing LED 439 and triggering transistor 445 into conduction. In turn, after a short time delay, SCR 453 is triggered to energize relay 454 and relay 457. Closing relay contact 456 applies B+ voltage to the flashing network 464 setting off LED 472 and audible alarm 473, providing indications of valid machine overheating. The closure of relay contact 455 applies the B+ voltage to the load reduction relay 460 initiating a scheduled reduction of load of the dynamoelectric machine such as a 3½ minute reduction in stator current to the point where no flow of liquid coolant is required to cool the stator windings. LED 463 is activated through relay contact 455 indicating that the load is being reduced.

Energizing relay 457 causes its normally closed contact 458 to open thus removing the B+ voltage from relay 417 which uncouples the overheat monitor from the overheat comparator input and deactivates the particle filter.

Operation of the control system during a malfunction of the overheat monitor is identical to that with a machine overheat until after activation of the particle filter. During a monitor malfunction, monitor signal current will not recover to the 70 percent level, following a drop in monitor signal to 60 percent and overheat comparator 364 will not be activated. The alarm comparator 363 remains activated and hence relay 417 remains energized, holding contact 418 closed and relay 479 energized. The normally closed contact 480 of relay 479 is held open, effectively disconnecting resistor 480 from its parallel connection with capacitor 482. Capacitor 482 is therefore allowed to charge toward the voltage level supplied by voltage regulator diode 484. The charging rate is determined by the size of resistor 483 and capacitor 482. When the voltage developed across capacitor 482 beomes equal to the timing reference voltage applied to the other input terminal of timing comparator 365, timing comparator 365 is activated, energizing LED 496 and relay 495. The monitor malfunction relay 501 is thereby energized to provide a remote indication of overheating signal invalidity and of monitor malfunction. LED 496 provides a local, visual indication of same.

Thus, in summary of operation of the circuit of FIG. 3, a monitor malfunction will be indicated unless overheat comparator 364 is activated prior to timing comparator 365 being activated, following an initial activation of alarm comparator 363.

To check operation of the control system, switch 361 is set to close contact 361c and open contact 361a and the position of selector switch 373 is varied to provide signals to the system which simulate overheating or a monitor malfunction. For example, to determine whether the control system will correctly validate machine overheating, selector switch 373 is moved to position 75A (alert), then to 60A (activate) for at least 6 seconds to verify that the particle filter relay 434 has been activated, then is moved to position 70-0 (overheating). Malfunction of the overheat monitor can be simulated by moving selector switch 373 to position 75A (alert), then setting it at position 60A for at least 3.5 minutes.

Figure 4:
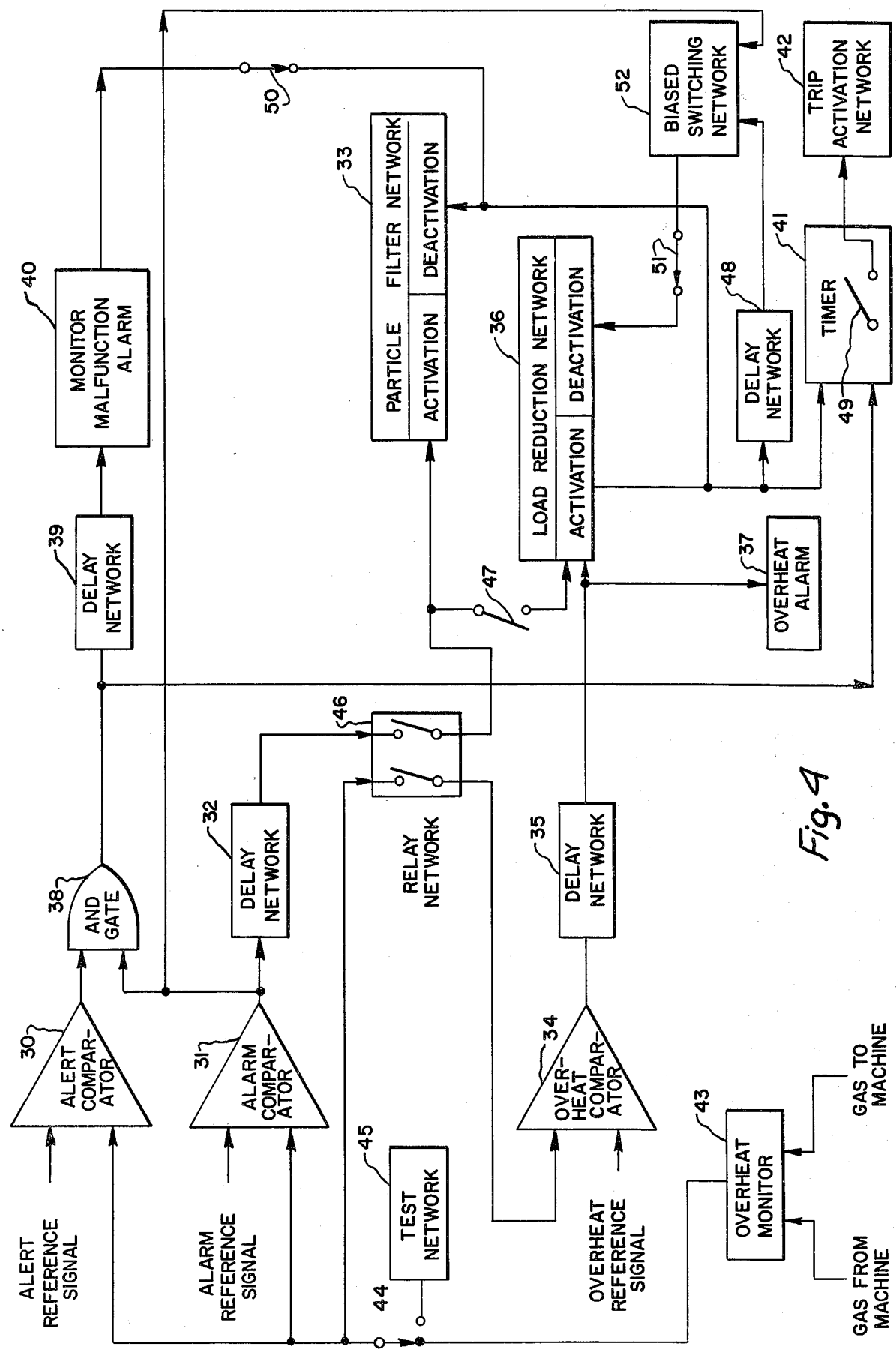
FIG. 4 is a block diagram of another embodiment of the invention.

FIG. 4 illustrates the major networks of another embodiment of the invention and the flow of signals during its operation. This arrangement of the control system comprises an alert network including alert comparator 30 and a light-emitting diode (not shown); an alarm network including alarm comparator 31, delay network 32, and particle filter network 33; an overheat network including overheat comparator 34, delay network 35, load reduction network 36 and overheat alarm 37; a malfunction network including AND gate 38, delay network 39, and monitor malfunction alarm 40; and a trip network including timer 41 and trip activation network 42.

Signals are applied to the control system from overheat monitor 43, or, if switch 44 is connected to test network 45, from test network 45, which may be used to check operation of the control system by applying to it signals simulating machine overheating or monitor malfunction. Overheat monitor 43 includes a particle filter which can be activated for removal of submicron particles from gas coolant flow and typically also includes a recorder for plotting monitor signals on a time chart, and a signal amplifier. The monitor signal, a direct current produced by amplifying the ion current of the overheat monitor, is applied to the inputs of alert comparator 30, alarm comparator 31, and, through the action of relay network 46, to the input of overheat comparator 34. Also applied to the inputs of each comparator is a suitable reference signal whose value establishes the monitor signal level required to energize each comparator. At the onset of local overheating in a machine, submicron pyrolysate particles are released into the gas coolant flow from the dynamoelectric machine to the overheat monitor 43 causing a drop in monitor current signal. Now, with reference also to the solid line of FIG. 2, which shows a typical monitor signal pattern during overheating and its verification in accordance with the invention, if the monitor current signal drops to the level of the alert reference signal (for example to 75 percent of full-scale value on the recorder of the overheat monitor 43), alert comparator 30 is energized and its output is fed to AND gate 38. A further drop in monitor signal to the level of the alarm reference signal applied to the input of alarm comparator 31 (for example to 60 percent of full-scale value) will energize alarm comparator 31 and initiate verification of machine overheating. The output of comparator 31 is fed to AND gate 38 and to delay network 32. After a suitable delay such as, for example, 6 seconds to protect the system from surges or transients, relay network 46 is tripped; this couples the overheat monitor signal to the input of overheat comparator 34 and energizes the particle filter network 33. At this point, switch 47, through its connection to load reduction network 36, provides the option of reducing load on the machine immediately after tripping of relay network 46; however, in the arrangement shown in FIG. 4, switch 47 is set in the open position so that load reduction network 36 is not triggered until after validation of overheating. Verification of overheating thus proceeds as the particle filter of the overheat monitor 43, activated by particle filter network 33, removes submicron particles from the gas flow, causing monitor signal current to recover. When monitor signal current rises to the level of the overheat reference signal applied to the input of overheat comparator 34, shown as 70 percent full value in FIG. 2, comparator 34 is energized, validating or confirming overheating of the dynamoelectric machine. The output of comparator 34 is delayed for 1-2 seconds, for example, in delay network 35 to protect the system from transients and surges, then triggers load reduction network 36 which initiates a reduction in load, trips overheat alarm 37, and sends a signal to delay network 48. Since filtration of pyrolysate particles is no longer desired, a signal is also sent to particle filter network 33, de-energizing the filter. The output signal from overheat comparator 34 is also fed into timer 41 which after a preset interval of time, for example five minutes, closes switch 49, passing the output of AND gate 38 to trip activation network 42. If the output of AND gate 38 is positive, indicating continued overheating (monitor signal less than or equal to 60 percent) in spite of load reduction, trip activation network 42 is energized, disconnecting the excitation system and the main line breaker of the dynamoelectric machine, the latter uncoupling the remaining load from the machine.

If a drop in monitor signal current occurs for reasons other than machine overheating, filtration of the gas passing through overheat monitor 43 does not result in a recovery of monitor signal but instead the monitor signal may continue to drop as indicated by dashed line A of FIG. 2. In the arrangement of FIG. 4 the application of output signals from alert comparator 30 and alarm comparator 31 to the input of AND gate 38 after the monitor signal drops to the 60 percent level produces an output from AND gate 38 which is fed into delay network 39. After a delay of approximately two minutes to allow time for particle filtration and recovery of the monitor signal had actual machine overheating been in progress, monitor malfunction alarm 40 is triggered, and if switch 50 is preset in a closed position, the particle filter is de-energized by the deactivation portion of particle filter network 33.

As an additional option of the control system, an automatic cycling feature is provided whereby (with switch 51 closed) after validation of overheating, the signal sent into delay network 48, which imposes a delay of about 45 seconds, passes into biased switching network 52. If overheating has ceased and the monitor signal from overheat monitor 43 is above the alarm reference signal (e.g., 60%) as indicated by the dashed curve C of FIG. 2, biased switching network 52 will provide an output triggering deactivation of load reduction by the deactivation portion of network 36. If overheating is continuing (dashed curve B of FIG. 2), the signal from re-energized alarm comparator 31 will not trigger load reduction deactivation through switching network 52, and load reduction of the machine will continue.

Figure 5A:
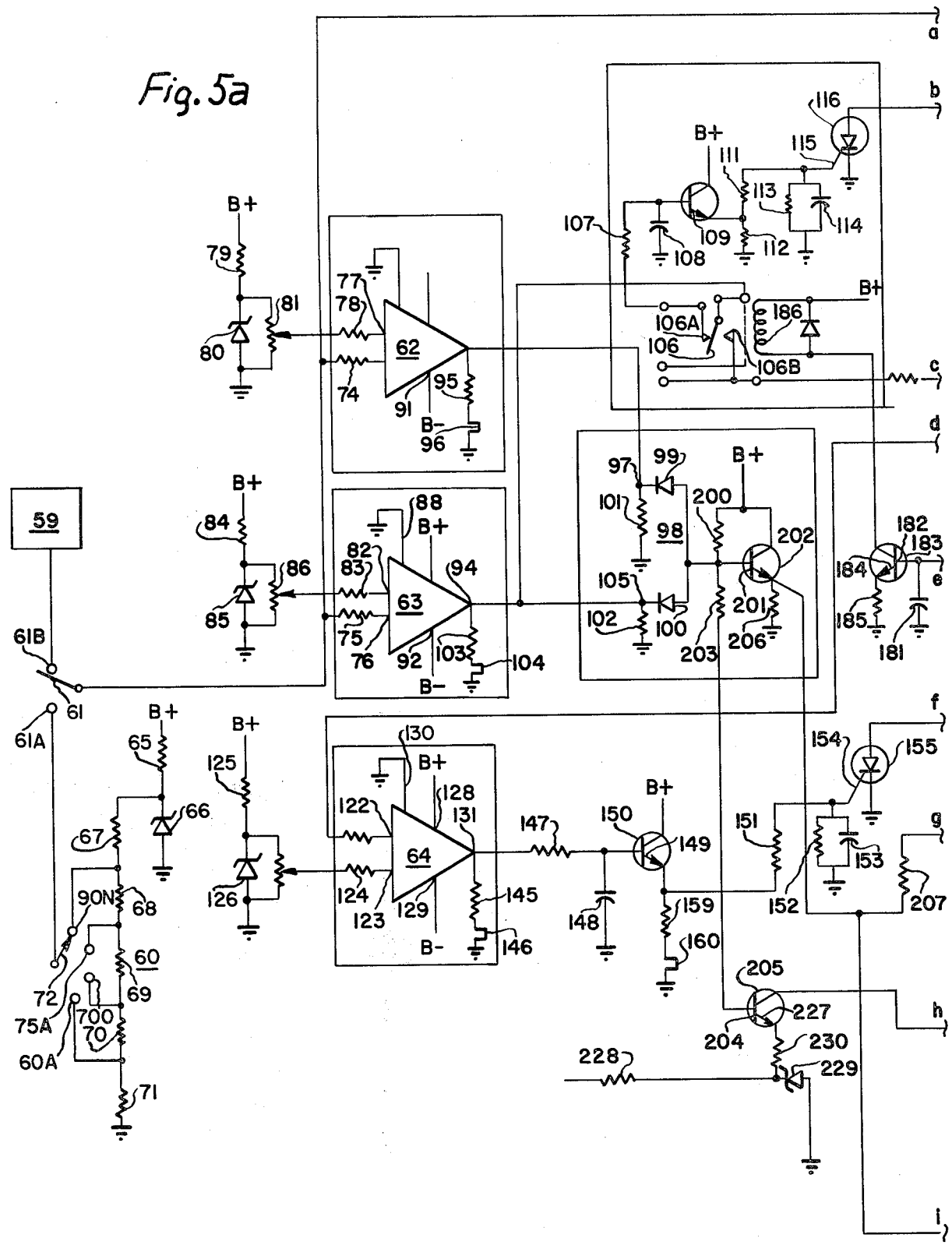
FIGS. 5a and 5b are a schematic circuit diagram in accordance with the invention as illustrated by the block diagram of FIG. 4.
Figure 5B:
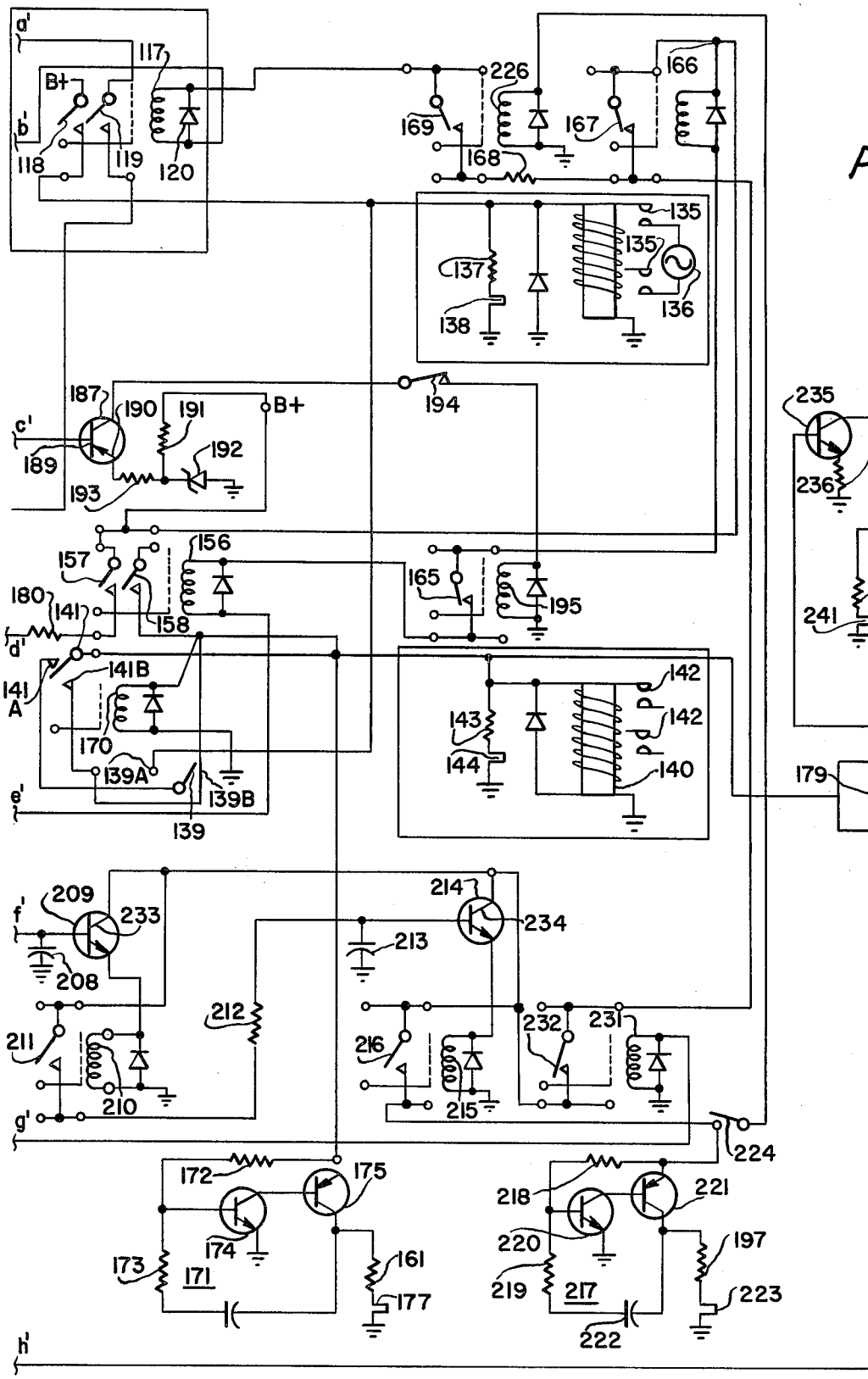

FIG. 5 shows a detailed schematic diagram of the arrangement of the control system illustrated in the block diagram of FIG. 4. The circuit of FIG. 5 was fully described in U.S. application Ser. No. 820,608, filed Aug. 1, 1977, which description is herein incorporated by reference thereto.

While there has been shown and described what is considered a preferred embodiment of the invention and the best known mode of its practice, it is understood that various other modifications may be made therein. For example, in machines which do not include means for a gradual or scheduled reduction in load, the load reduction network of the control system may be eliminated and system components arranged to cause tripping of the load and excitation system from the machine instead of a scheduled reduction of load subsequent to validation of overheating. Also, it should be understood that the delay times and the reference signal levels (expressed as percent full scale) specified herein are values typical of a particular machine operating in a particular manner and that other values may be appropriate for different machines and different modes of operation. It is intended to claim all such modifications which fall within the true spirit and scope of the present invention.

What is claimed is:

1. In combination with an overheat monitor for a gas-cooled dynamoelectric machine carrying an electrical load, the monitor responding to overheating by detecting submicron pyrolysis particles entrained in the gas coolant and including a filter capable of removing the submicron pyrolysis particles from the gas coolant passing through the monitor, a control system to verify an apparent overheating signal and to initiate action based on the validity of the signal, said control system comprising:
    an alarm network providing an output signal in response to an apparent overheating signal from said overheat monitor;
    a particle filter network for initiating filtration of cooling gas passing through said overheat monitor in response to the output signal of said alarm network;
    an overheat network providing an output signal in response to loss of the apparent overheating signal following initiation of filtration, the output signal of said overheat network being indicative of a valid overheating signal;
    switching means to connect said overheating signal to said overheat network, said switching means being activated by the output signal from said alarm network so that said overheat network becomes responsive to said overheating signal following a first response by said alarm network;
    a timer network having a first input for receiving the output signal from said alarm network and a second input for receiving the output signal from said overheat network, said timer network providing an output signal indicative of overheating signal invalidity upon expiration of a preselected time period, said time period being initiated in response to the output signal of said alarm network and terminated prior to expiration in response to the output signal of said overheat network;
    a monitor malfunction network adapted to provide an alarm in response to said timer network output, said alarm being indicative of a malfunction in said overheat monitor; and
    a load reduction network for initiating a load reduction on said dynamoelectric machine in response to a valid overheating signal as indicated by the output signal of said overheat network.

2. The combination according to claim 1, further comprising:
    a timer switch having a first input for receiving the output signal from said alarm network and a second input for receiving a signal indicative of a load reduction from said load reduction network, said timer switch adapted to provide an output signal in response to said alarm network signal and the expiration of a preselected time period, said time period commencing upon activation of said load reduction network and terminating prior to expiration of said time period upon deactivation of said load reduction network, said timer switch output signal indicative of continued overheating; and,
    a trip activation network responsive to the output signal of said timer switch, whereby excitation and remaining load are removed from the dynamoelectric machine.

3. The control system recited in claim 2 further comprising a switch interconnecting the alarm network and the load reduction network whereby said load reduction network may be made selectively responsive to said alarm network.

4. The combination according to claim 3 further comprising:
    a test network having an adjustable output signal of magnitude equivalent to the output signal range of said overheat monitor to facilitate operation of the control system to be checked by simulating machine overheating or a malfunction of said overheat monitor.

5. The combination according to claim 4 further comprising:
    an alert network adapted to respond to said apparent overheating signal prior to said alarm network responding thereto, said alert network response being indicative of an overheating alert condition.

6. The control system according to claim 5 wherein:
    said alert network comprises a comparator and a light-emitting diode, said comparator having a first input for receiving a monitor signal from said overheat monitor, a second input for receiving a reference signal equal to a first preselected value, and an output for providing an output signal to said light-emitting diode in response to a drop in said monitor signal to said first preselected value;
    said alarm network comprises a comparator, a light-emitting diode, a delay network, a silicon-controlled rectifier, and a particle filter activation relay coil, said comparator having a first input for receiving a monitor signal from said overheat monitor, a second input for receiving a reference signal equal to a second preselected value, and an output for providing excitation to said light-emitting diode and particle filter activation relay coil in response to a drop in said monitor signal to said second preselected value;
    said overheat network comprises a comparator, a light-emitting diode, a delay network, a silicon-controlled rectifier, a particle filter deactivation relay coil, and a load reduction relay coil, said comparator having a first input for receiving a monitor signal from said overheat monitor, a second input for receiving a reference signal equal to a third preselected value, and an output for providing excitation to said light-emitting diode, said particle filter deactivation relay coil, and said load reduction relay coil in response to a rise in said monitor signal to said third preselected value, said first preselected value being greater than said third preselected value and said third preselected value being greater than said second preselected value; said timer network comprises a comparator, a resistance-capacitance charging network, and a time period initiation relay, said comparator having a first input for receiving a signal from said resistance-capacitance charging network, a second input for receiving a preselected reference signal, and an output for providing an output signal in response to a rise in said signal from said resistance-capacitance network to said preselected reference signal; and said monitor malfunction alarm comprises a light-emitting diode and a relay coil.

* * * * *